(12) United States Patent
He et al.

(10) Patent No.: US 6,939,766 B1
(45) Date of Patent: Sep. 6, 2005

(54) METHOD FOR FABRICATING A FLASH MEMORY DEVICE

(75) Inventors: Yue-Song He, San Jose, CA (US); Richard M. Fastow, Cupertino, CA (US); Jianshi Wang, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/616,804

(22) Filed: Jul. 9, 2003

(51) Int. Cl.[7] .......................................... H01L 21/8247
(52) U.S. Cl. ..................................................... 438/264
(58) Field of Search ................................ 438/257–267

(56) References Cited

U.S. PATENT DOCUMENTS

| | | | |
|---|---|---|---|
| 5,294,571 A * | 3/1994 | Fujishiro et al. | 438/770 |
| 6,165,883 A * | 12/2000 | Hiura | 438/592 |
| 6,582,998 B2 * | 6/2003 | Nitta | 438/217 |
| 6,617,636 B2 * | 9/2003 | Tuan et al. | 257/315 |

* cited by examiner

*Primary Examiner*—Richard A. Booth

(57) ABSTRACT

The present invention is a method for fabricating a flash memory device. In one embodiment, a gate structure comprising a tunnel oxide layer, a floating gate layer, an oxide layer, and a control gate layer is fabricated on a semiconductor substrate. A rapid thermal oxidation (RTO) process is then performed to repair the tunnel oxide layer.

14 Claims, 9 Drawing Sheets

METHOD FOR FABRICATING A FLASH MEMORY DEVICE

TECHNICAL FIELD

BACKGROUND ART

Flash memory devices have found growing commercial success in the electronic device market due in part to the ability of flash memory devices to store electronic data over long periods of time without an electric power supply. Additionally, flash memory devices can be erased and programmed over multiple write cycles after they have been installed in an electronic device. This combined functionality is especially useful in electronic device applications such as cellular telephones, personal digital assistants, computer BIOS storage, etc., where power supply is intermittent and programmability and data retention are desired.

Flash memory technology evolved from electrically erasable read only memory (EEPROM) chip technology, which can be erased in situ. Unlike dynamic random access memory (DRAM) devices and static random memory (SRAM) devices in which a single byte can be erased, flash memory devices are typically erased in fixed multi-bit blocks or sectors.

One type of flash memory device is constructed in a cell structure wherein a single bit of information is stored in each cell. FIG. 1 is a cross section view of an exemplary flash memory device. Memory device 100 is comprised of a substrate 101 having a source region 102 and a drain region 103. Typically, substrate 101 is a crystalline silicon semiconductor substrate which has undergone an N-type (electron rich) doping in source region 102 and drain region 103. Memory device 100 further comprises a gate array 104, also referred to as a "stack gate array." In the embodiment of FIG. 1, gate array 104 is comprised of a tunnel oxide layer 105, a floating gate 106, and insulating layer 107, and a control gate 108. A channel region 109 underlies gate array 104 between source region 102 and drain region 103.

The single bit stacked gate flash memory cell (e.g., memory cell 100 of FIG. 1) is typically programmed by "channel hot electron injection" in which a high positive voltage is applied to control gate 108, source 102 is coupled to ground and drain 103 is coupled to a positive voltage. The resulting high electric field across the channel region accelerates electrons toward the drain region and imparts enough energy for them to become hot electrons. The hot electrons are scattered (e.g., by impurities or the substrate lattice structure of the substrate in the channel region) and are redirected toward the floating gate by the vertical field established by the positive control gate voltage. If the electrons have enough energy, they can tunnel through gate oxide 105 into floating gate 106 and become trapped there. This changes the threshold voltage $V_T$, and thereby the channel conductance, of memory cell 100.

Memory cell 100 is read by connecting the source region 102 to ground, raising the voltage at the control gate 108 to the sense level and connecting the drain region 103 to a sense amplifier; if memory cell 100 is programmed, no current flows to the sense amplifier.

In order to erase memory cell 100, a voltage (e.g., 9 to 11 volts) is applied to the P-well 102, control gate 108 is held at a negative potential, and drain region 103 is allowed to float. Under these conditions, an electrical field is developed across tunnel oxide 105 between floating gate 106 and P-well 101. The electrons that are trapped in floating gate 106 flow toward and cluster at the portion of floating gate 106 overlying P-well 102.

In a typical manufacturing process, gate array 104 is fabricated by depositing successive layers of materials and performing a photolithographic etch through these layers down to the level of substrate 101. Frequently, this etching step results in damage to the tunnel oxide layer 105. For example, reaction between tunnel oxide layer 105 and the etchant may cause a degradation of the edge of the tunnel oxide layer such that it takes on a concave profile. Additionally, there may be some degradation at the junction of the tunnel oxide layer and the polysilicon of floating gate layer 106 such that the polysilicon layer is undercut.

In a conventional manufacturing process, lost or damaged tunnel oxide material is rebuilt during a re-oxidation process. Typically this involves placing the memory device in a furnace to induce a reaction between the material of tunnel oxide layer 105 and either dry oxygen or water vapor. During the course of the oxidation process, oxygen or water molecules diffuse into tunnel oxide layer 105 which expands the volume of the tunnel oxide material and thus rebuild the damaged tunnel oxide layer. Additionally, the oxygen or water molecules diffuse into the polysilicon of floating gate 106 and/or the silicon of substrate 101. As a result, the a portion of the junction between tunnel oxide layer 105 and floating gate layer 106 and/or substrate 101 becomes oxidized. FIG. 2 shows a section view of an exemplary flash memory device 200 that has been repaired using a conventional oxidation process. As shown in FIG. 2, tunnel oxide layer 105 extends into a portion of floating gate layer 106 and into a portion of substrate 101. This is not problematic in that the gate array 104 has a sufficient gate length (e.g., gate length 210) such that there is a portion of the tunnel oxide layer 105 (e.g., region 230 of FIG. 2) that has a uniform thickness.

Current technology trends are creating increasingly compact semiconductor structures in order to increase circuit density and to improve performance. One technique manufacturers use to scale down the size of semiconductor devices is to decrease the gate length of gate array 104. However, in memory devices having reduced gate lengths (e.g., $0.21\mu$–$0.14\mu$), conventional methods for repairing damage to the tunnel oxide layer are proving disadvantageous.

FIG. 3 shows a section view of a prior art flash memory device 300 having a short channel length (e.g., less than $0.21\mu$). Due to the reduced gate length of gate array 104, oxidation of floating gate layer 106 and/or substrate 101 extends further into the interior of the gate array. Thus, in flash memory device 300, tunnel oxide layer 105 has a non-uniform profile. A non-uniform tunnel oxide layer is problematic when erasing a charge from insulating layer 107. As discussed above, in an erase operation, electrons are forced from insulating layer 107 into the channel region of substrate 101 (e.g., channel 109 of FIG. 1) underlying gate array 104 using Fowler-Nordheim tunneling. However, when tunnel oxide layer 105 has a non-uniform profile, as in FIG. 3, the erase voltage threshold ($V_{TE}$) distribution becomes much wider. This can result in a phenomenon known as "overerase". Once overerased, a flash memory cell cannot be programmed or read again within practical limits because of excessive memory transistor source-drain current, which grounds the bit line read or programming voltage.

Additionally, the oxidation process to repair damage to tunnel oxide layer 105 may occur after dopants have been implanted into source region 102 and drain region 103. Conventional methods for repairing damage to tunnel oxide layer 105 may result in what is known as "short channel effects" in memory devices having reduced gate length dimensions. For example, a conventional oxidation process may comprise placing memory device 100 in a furnace for 5–10 minutes and reach a peak processing temperature of approximately 900° C. However, this may also result in the dopants in source region 102 and drain region 103 to diffuse farther into channel region 109. As a result, undesirable short-channel characteristics may be exhibited. In short-channel devices, as the drain bias is increased, the drain depletion region widens into the channel and can merge with the source depletion region. This results in punch-through leakage between the source and drain and loss of gate control over the device.

This encroachment of the depletion region from the drain into the channel is known as Drain Induced Barrier Lowering (DIBL). The increase in leakage current associated with DIBL is especially problematic in flash memory devices as they are widely used in very low power applications, for example in mobile phones, due to the ability of flash memory to retain information without applied power. Increases in leakage current may have a significant deleterious effect on total power consumption of the product using the flash device. Furthermore, as DIBL increases, it becomes increasingly difficult to program the memory cell. Therefore, controlling DIBL is becoming increasingly important as the scale of flash memory devices decreases.

Thus, prior art methods for repairing damage to tunnel oxide layers are disadvantageous in that they may result in a non-uniform profile of the tunnel oxide layer in flash memory devices with a reduced gate length. This may cause difficulties in programming and/or erasing of flash memory cells. Additionally, they may result in more pronounced short channel effects in memory devices with a reduced gate length which may result in greater power consumption of the flash memory device and/or difficulty in programming the flash memory cells.

DISCLOSURE OF THE INVENTION

A method for fabricating a flash memory device is disclosed. In one embodiment, a gate structure comprising a tunnel oxide layer, a floating gate layer, an oxide layer, and a control gate layer is fabricated on a semiconductor substrate. A rapid thermal oxidation (RTO) process is then performed to repair the tunnel oxide layer.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

MODES FOR CARRYING OUT THE INVENTION

Reference will now be made in detail to embodiments of the present invention, examples of which are illustrated in the accompanying drawings. While the present invention will be described in conjunction with the following embodiments, it will be understood that they are not intended to limit the present invention to these embodiments alone. On the contrary, the present invention is intended to cover alternatives, modifications, and equivalents which may be included within the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

The present invention is a method for fabricating a flash memory device. In one embodiment, after an etching process has been performed to create a gate stack, a rapid thermal oxidation (RTO) process is performed to repair portions of the gate stack that were damaged during the etching process. Embodiments of the present invention facilitate the fabrication of flash memory devices having reduced gate lengths because the RTO process results in a more uniform profile of the tunnel oxide layer. Additionally, using the RTO process over conventional methods for repairing the tunnel oxide layer in that diffusion of dopants into the channel region from the source and drain areas is less likely to occur.

Figure 1:
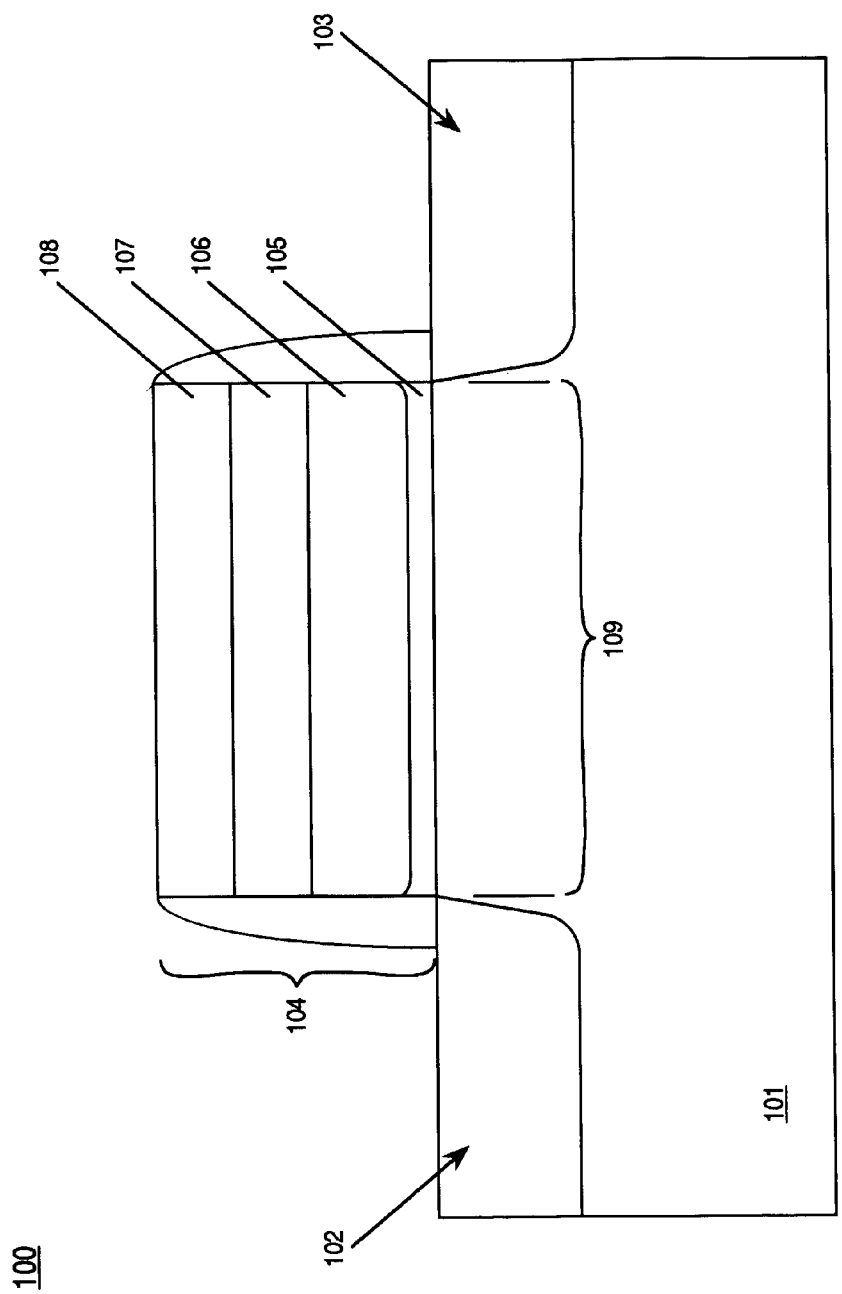
FIG. 1 is a cross section view of an exemplary prior art flash memory device.
Figure 2:
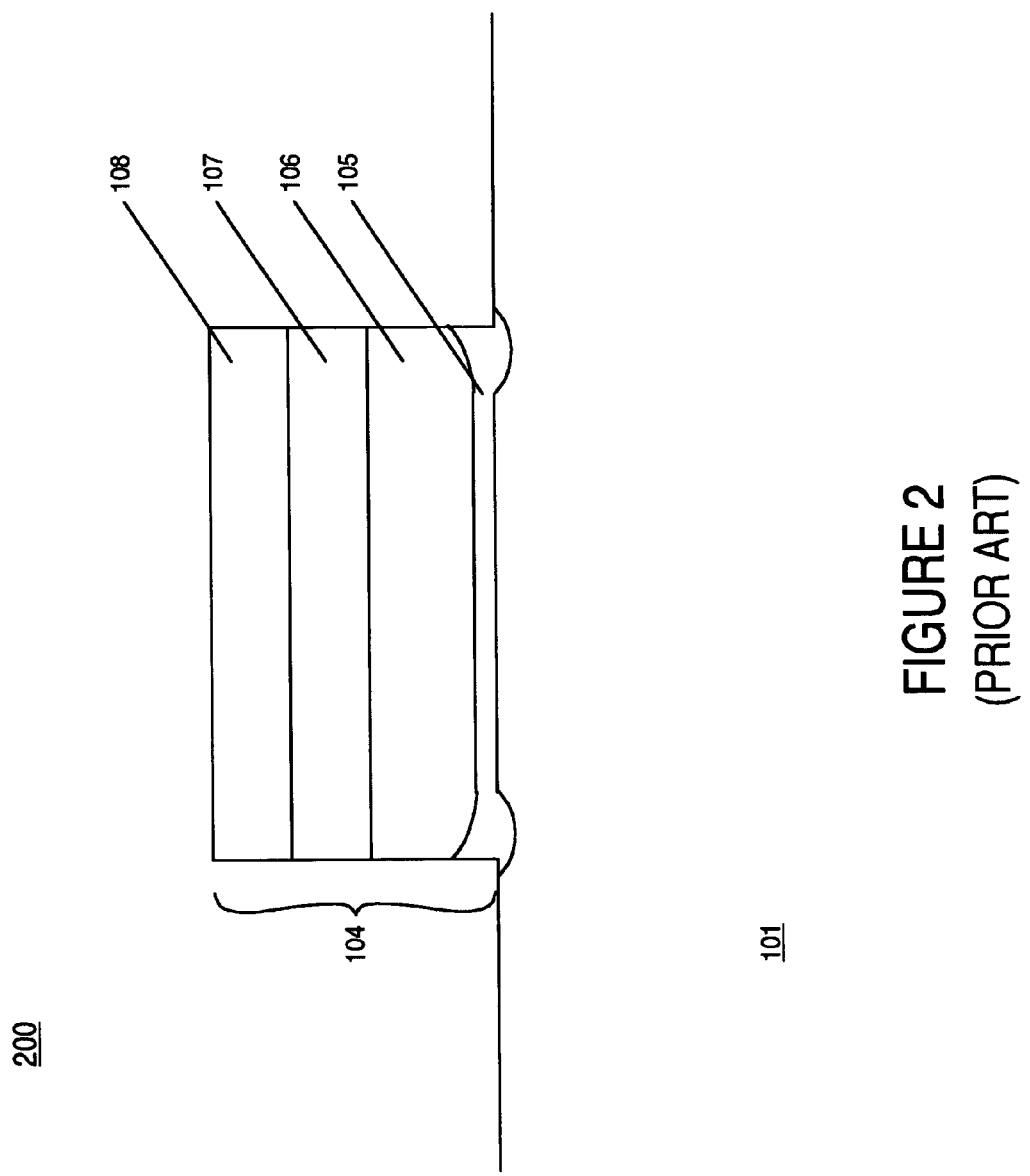
FIG. 2 is a cross section view of an exemplary prior art flash memory device following a conventional oxidation process.
Figure 3:
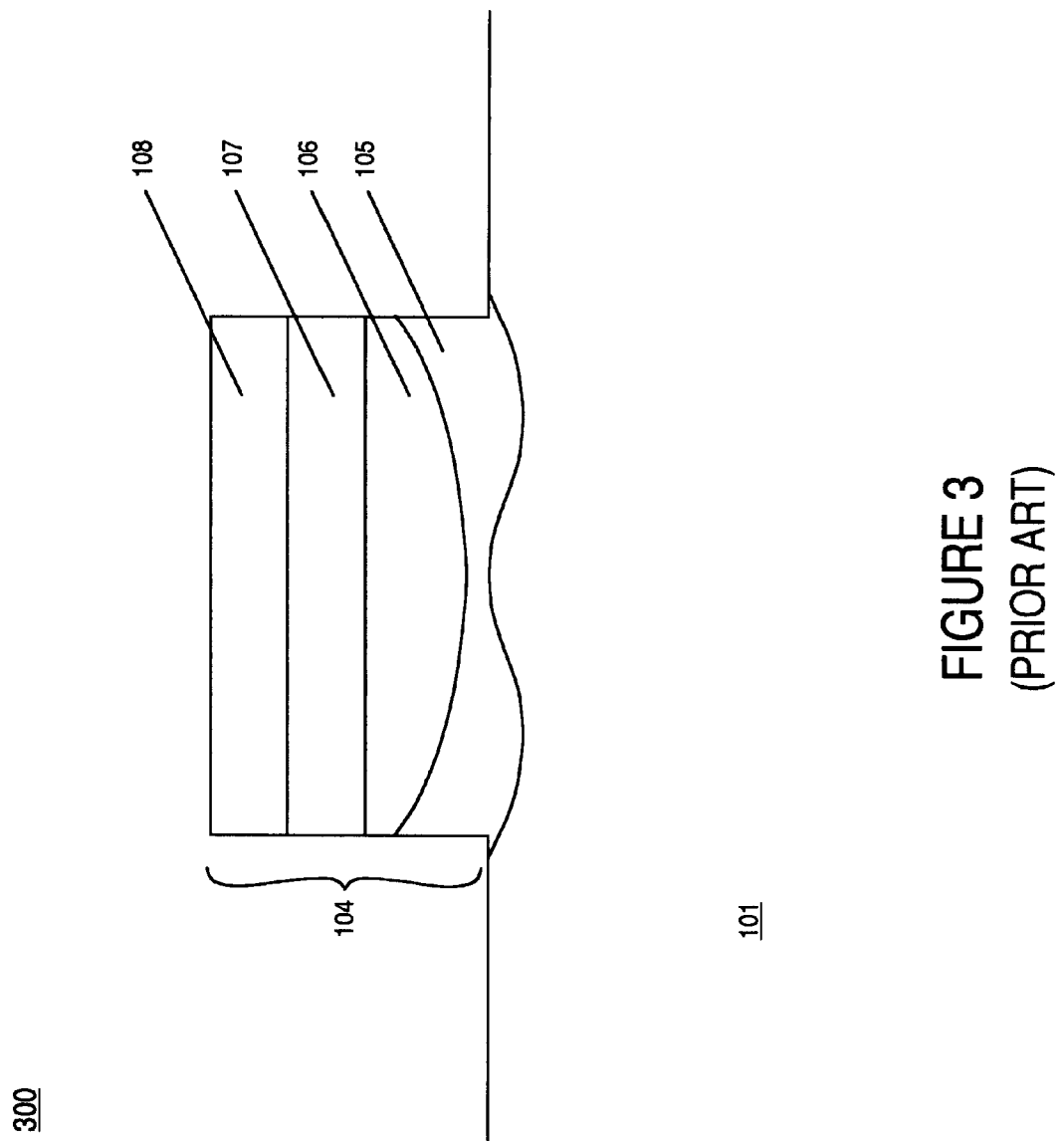
FIG. 3 is a cross section view of an exemplary prior art flash memory device having a reduce gate length following a conventional oxidation process.
Figure 4:
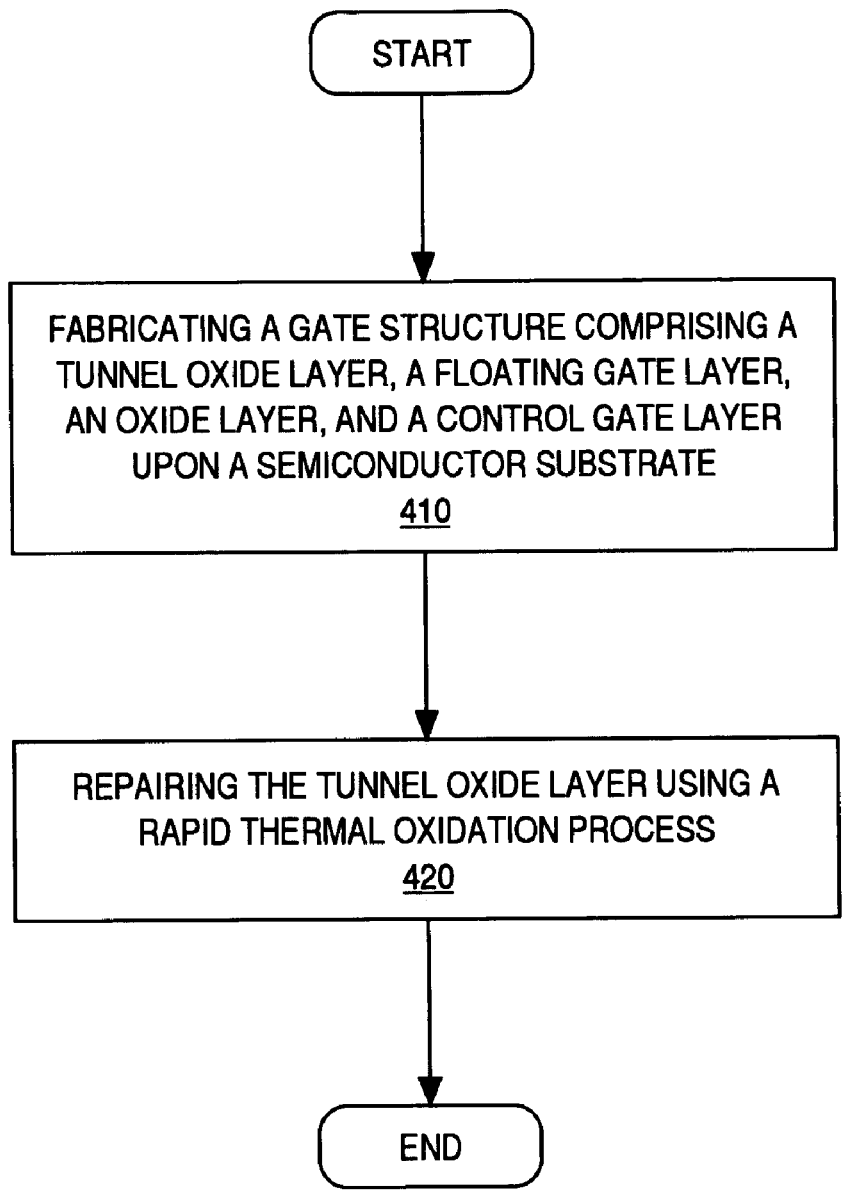
FIG. 4 is a flowchart of a method for fabricating a flash memory device in accordance with embodiments of the present invention.
Figure 5A:
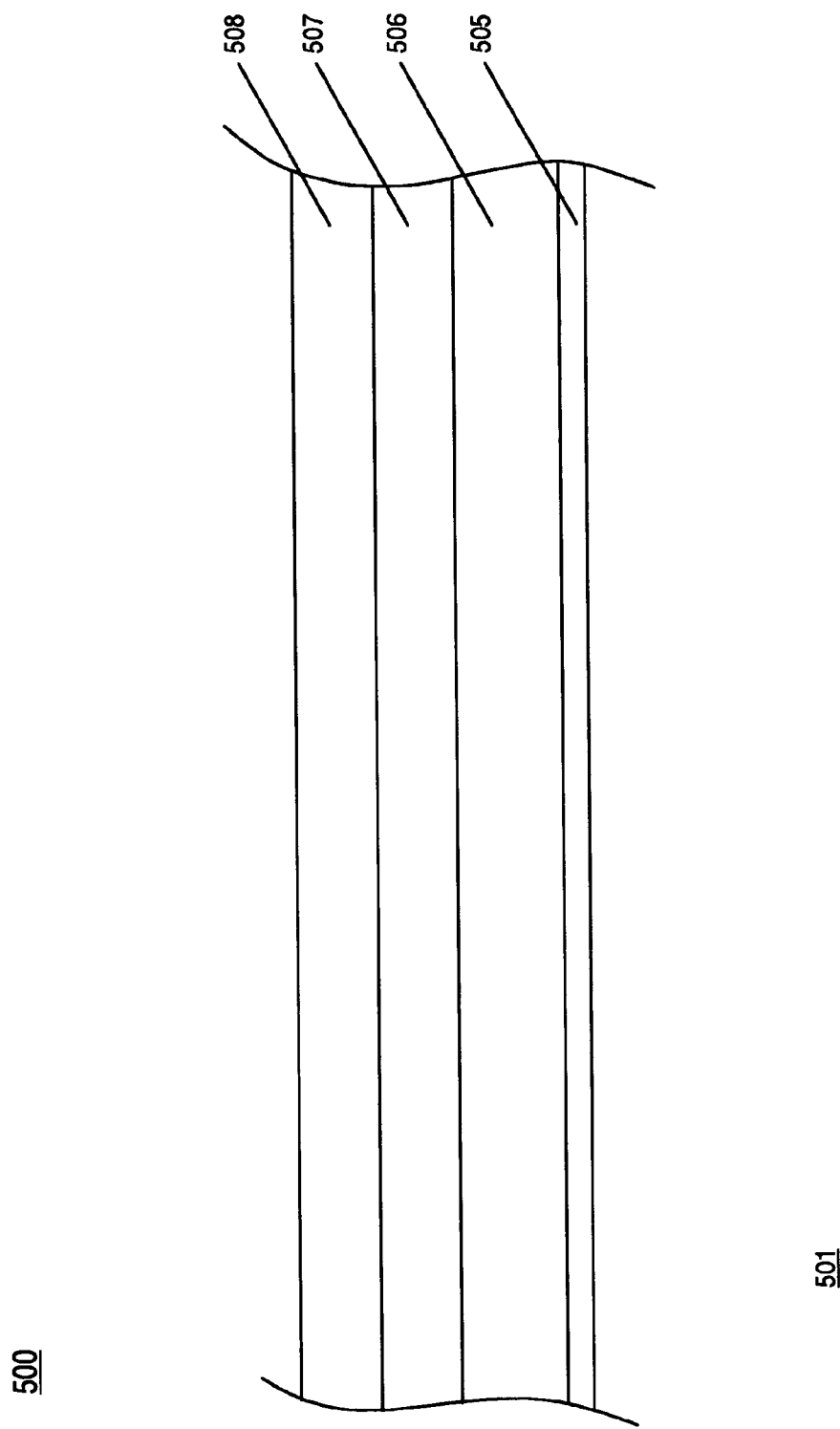
FIGS. 5A, 5B, and 5C are cross section views of an exemplary memory device fabricated in accordance with embodiments of the present invention.
Figure 5B:
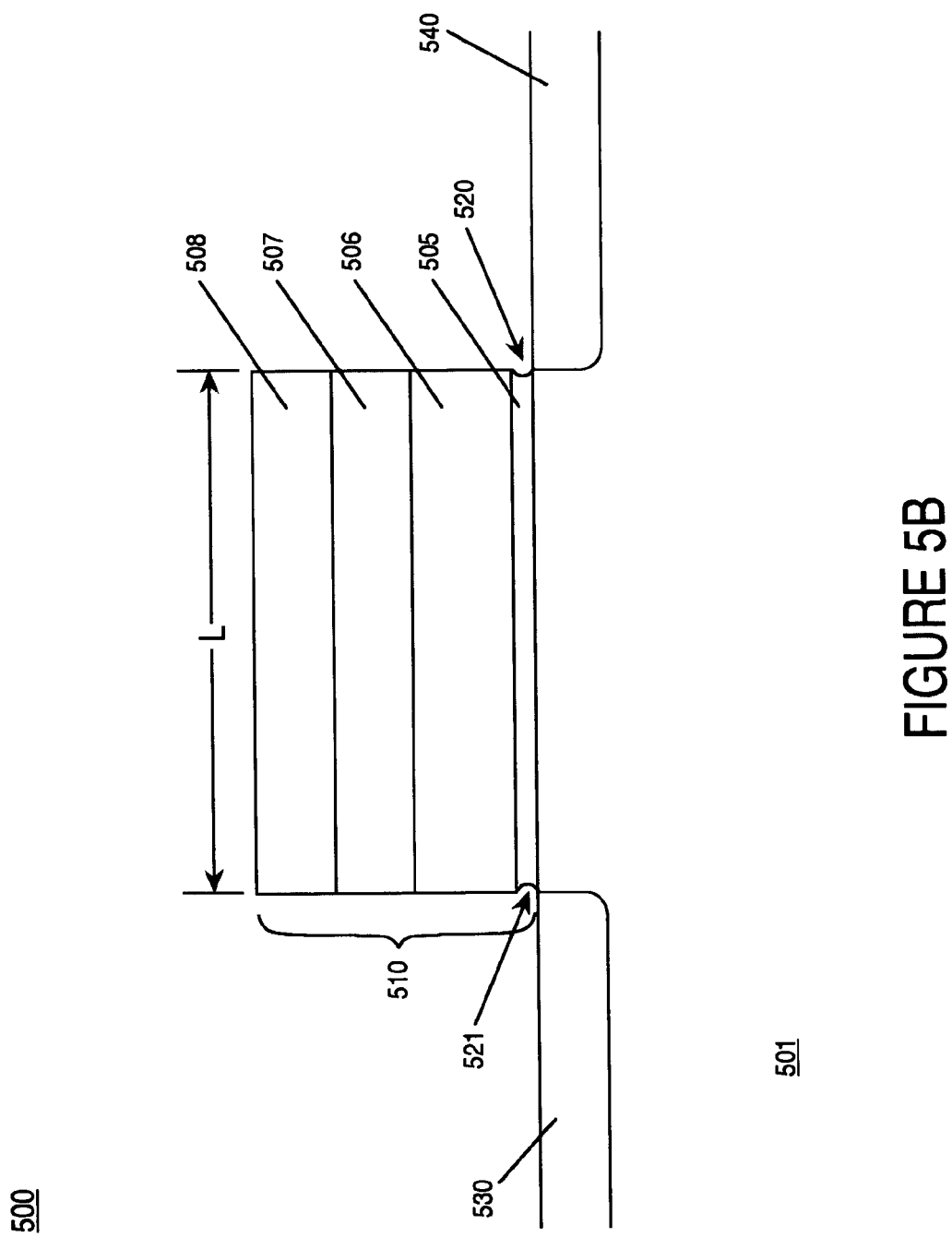

FIG. 4 is a flowchart of a method 400 for fabricating a flash memory device in accordance with embodiments of the present invention. In step 410 of FIG. 4, a gate structure comprising a tunnel oxide layer, a floating gate layer, an oxide layer, and a control gate layer are fabricated upon a semiconductor substrate. Referring now to FIGS. 5A and 5B which are section views of an exemplary memory device 500 fabricated in accordance with embodiments of the present invention, a plurality of layers are deposited upon a semiconductor substrate 501. In the embodiment of FIG. 4, these layers comprise a tunnel oxide layer 505, a floating gate layer 506, an oxide layer 507, and a control gate layer 508.

In FIG. 5B, the layers have been etched to create the stack gate structure 510. As stated above, as a result of the etching of the stack gate structure, unintended damage to tunnel oxide layer 505 frequently occurs. As shown in FIG. 5B, the portions of tunnel oxide layer 505 that are located adjacent to the etched areas of stack gate 510 have been damaged. In other words, oxide material has been removed from regions 520 and 521 of tunnel oxide layer SOS. In the embodiment of FIG. 5, the gate length (L) of stack gate 510 is less that 0.21 microns (0.21μ).

Also shown in FIG. 5B are source region 530 and drain region 540. Source region 530 and drain region 540 are impurity concentrations created in semiconductor substrate 501. There are a variety of methods for depositing dopants into semiconductor substrate 501 such as high energy implanting, diffusion, chemical vapor deposition, plasma enhanced chemical vapor deposition, low pressure chemical vapor deposition, etc., to create source region 530 and drain region 540. While the present embodiment recites these methods specifically, the present invention is well suited to using other methods for creating source region 530 and drain region 540. Additionally, source region 530 and drain region 540 may be created in fabrication steps that are subsequently performed. This will be more clearly explained in the following discussion below.

Figure 5C:
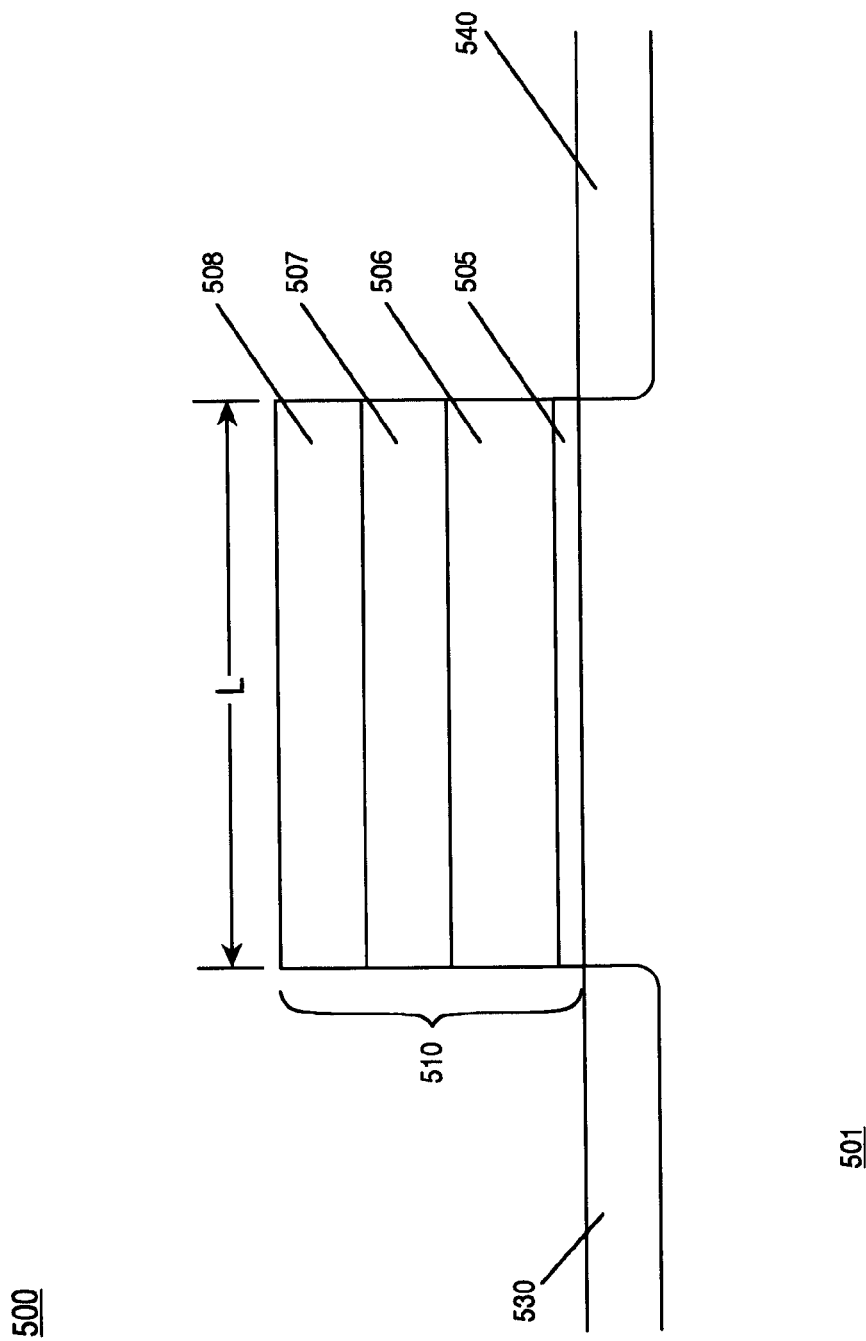

In step 420 of FIG. 4, the tunnel oxide layer is repaired using a rapid thermal oxidation process. Referring now to FIG. 5C, the damaged regions of tunnel oxide layer 505 that were damaged in the etching of stack gate 510 are repaired by creating addition oxide material in the damaged regions (e.g., regions 520 and 521 of FIG. 5B) using a rapid thermal oxidation process.

A conventional method for repairing damage to tunnel oxide layer 505 comprises placing a plurality of memory devices in a clean silica tube that can be heated to very high temperatures, typically around 900° C., using heating coils in a furnace with ceramic brick insulating liners. An oxygen containing gas such as $O_2$ or $H_2O$ is flowed across the semiconductor devices to facilitate oxidation of the silicon in the memory device. A typical conventional oxidation process takes from 5–10 minutes due, in part, to the high thermal mass of the oven and the plurality of memory devices and may reach a peak processing temperature of approximately 900° C. Due to the amount of time the memory device is maintained at a high temperature, oxidation of areas adjacent to the tunnel oxide layer can occur deeper within the stack gate of the memory cell. As stated above, in memory devices having reduced gate lengths (e.g., less than 0.21 $\mu$), the oxidation can penetrate into the stack gate structure such that the tunnel oxide layer takes on a non-uniform profile. This in turn leads to a wider distribution of the erase voltage threshold ($V_{TE}$) which can cause overerase of the memory cell and column leakage of current.

In the present invention, a rapid thermal oxidation process is used to repair damaged regions of the tunnel oxide layer (e.g., tunnel oxide layer 505 of FIG. 5). In an exemplary rapid thermal oxidation process, semiconductor wafers are processed individually in ovens designed to facilitate rapid heating and cooling of the semiconductor substrate. This is advantageous because the desired processing temperature can be reached more quickly and because the semiconductor substrate can be cooled more quickly after the processing has finished. In using rapid thermal oxidation, the present invention reduces the amount of time that memory device 500 is maintained in a high temperature environment. An exemplary rapid thermal oxidation process of the present invention is performed for a duration of approximately 20 seconds and reaches a peak processing temperature of approximately 1000° C. In one embodiment, the rapid thermal oxidation process is performed upon memory device 500 prior to creating source region 530 and drain region 540. This is advantageous because dopants in source region 530 and drain region 540 can not be diffused into the channel region underlying stack gate 510 during the rapid thermal oxidation process.

Figure 6:
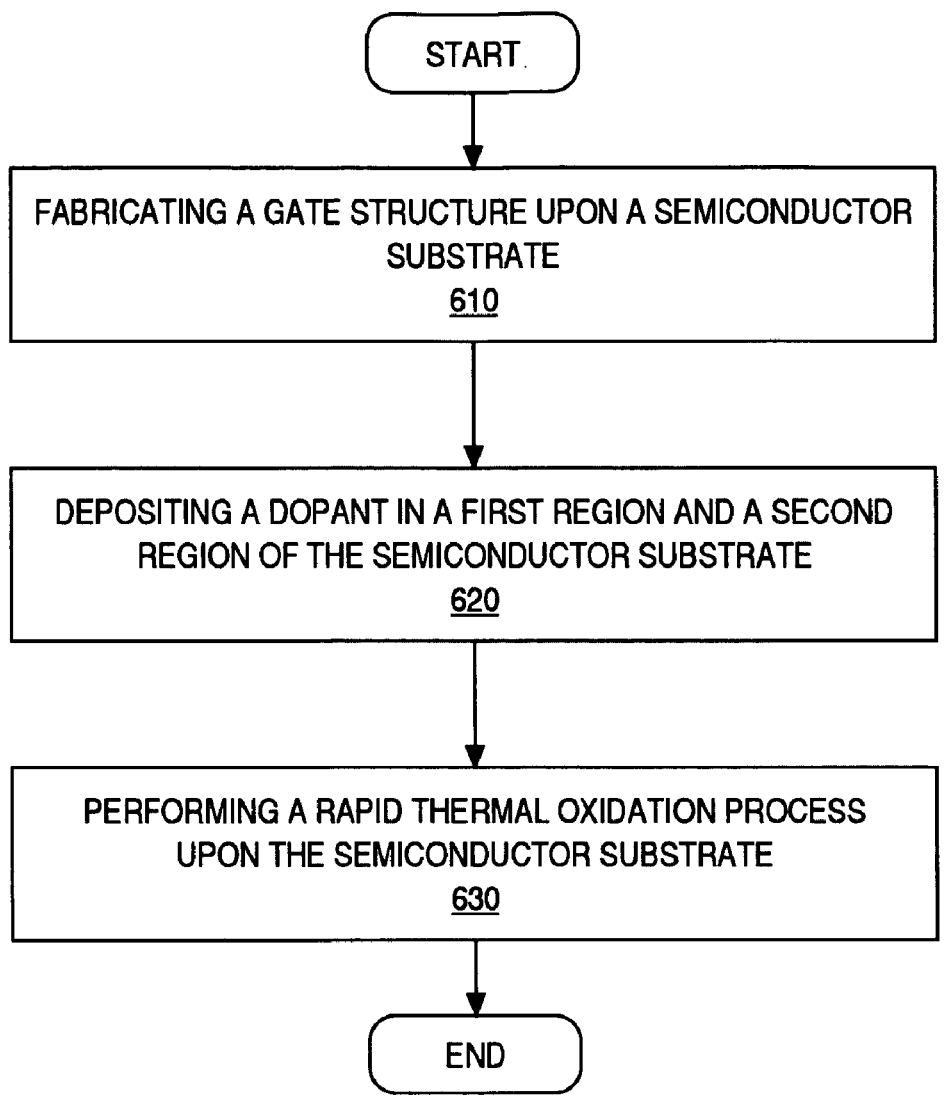
FIG. 6 is a flowchart of a method for fabricating a memory device in accordance with embodiments of the present invention.

FIG. 6 is a flowchart of a method 600 for fabricating a memory device in accordance with embodiments of the present invention. In step 610 of FIG. 6, a gate structure is fabricated upon a semiconductor substrate. Referring again to FIG. 5B, a stack gate structure 510 is fabricated upon semiconductor substrate 501 of memory device 500. In embodiments of the present invention, memory device 500 comprises a flash memory device. Additionally, embodiments of the present invention are well suited for flash memory devices wherein the gate length (L) of stack gate structure 510 is less than 0.21 microns (0.21$\mu$).

In step 620 of FIG. 6, a dopant is deposited in a first region and a second region of the semiconductor substrate. Referring again to FIG. 5B, a deposition of a dopant is performed to create source region 530 and drain region 540. As stated above, there are a variety of methods for depositing dopants into semiconductor substrate 501 such as high energy implanting, diffusion, chemical vapor deposition, plasma enhanced chemical vapor deposition, low pressure chemical vapor deposition, etc., to create source region 530 and drain region 540. While the present embodiment recites these methods specifically, the present invention is well suited to using other methods for creating source region 530 and drain region 540.

In step 630 of FIG. 6, a rapid thermal oxidation process is performed upon the semiconductor substrate. Referring again to FIG. 5C, the damaged regions of tunnel oxide layer 505 (e.g., regions 520 and 521 of FIG. 5B) that were damaged in the etching of stack gate 510 are repaired by creating addition oxide material using a rapid thermal oxidation process.

In the present invention, a rapid thermal oxidation process is used to repair damaged regions (e.g., regions 520 and 521 of FIG. 5B) of the tunnel oxide layer (e.g., tunnel oxide layer 505 of FIG. 5B). An exemplary rapid thermal oxidation process of the present invention is performed for a duration of approximately 20 seconds and reaches a peak processing temperature of approximately 1000° C. This is advantageous over conventional oxidation methods because the desired processing temperature can be reached more quickly and because the semiconductor substrate can be cooled more quickly after the processing has finished. This reduces the amount of time that areas adjacent to tunnel oxide layer 505 may are exposed to the oxidation process. As a result, tunnel oxide layer 505 exhibits a more uniform profile which allows manufacturers to utilize a more narrowly defined range of channel erase threshold voltages ($V_{TE}$). Thus, the present invention reduces the possibility of overerase and column leakage in flash memory devices.

As stated above, flash memory devices having reduced gate lengths (e.g., less than 0.21$\mu$) may exhibit short channel effects subsequent to conventional oxidation processing methods. By a using rapid thermal oxidation process, the present invention reduces the amount of time that memory device 500 is maintained in a high temperature environment; As a result, the dopants in source region 530 and drain region 540 are less likely to diffuse into the channel region of substrate 501 underlying stack gate 510. Thus, embodiments of the present invention are advantageous over conventional oxidation processes in that short channel effects such as drain induced barrier lowering (DIBL) are less likely to be exhibited in flash memory devices fabricated in accordance with the present invention. In one embodiment, the rapid thermal oxidation process is performed upon memory device 500 prior to creating source region 530 and drain region 540. This is advantageous because dopants in source region 530 and drain region 540 can not be diffused into the channel region underlying stack gate 510 during the rapid thermal oxidation process.

Figure 7:
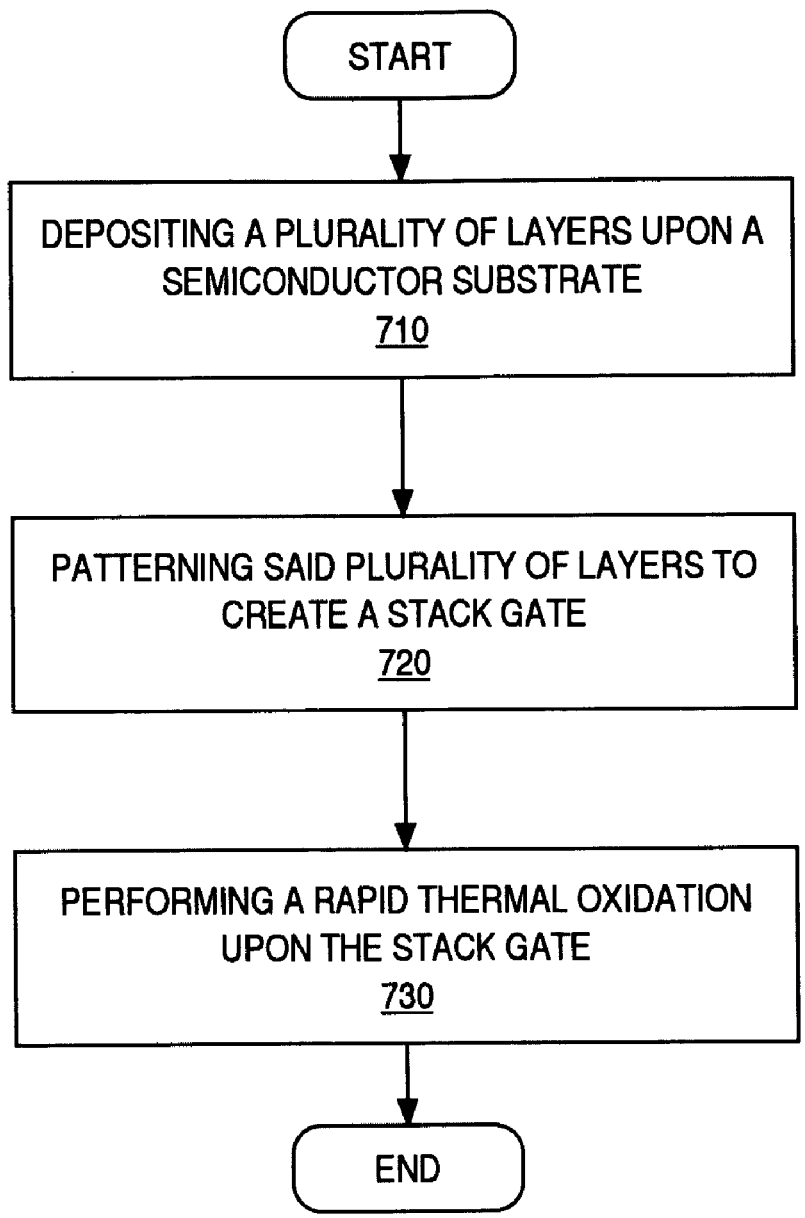
FIG. 7 is a flowchart of a method for fabricating a memory device in accordance with embodiments of the present invention.

FIG. 7 is a flowchart of a method 700 for fabricating a memory device in accordance with embodiments of the present invention. In step 710 of FIG. 7, a plurality of layers are deposited upon a semiconductor substrate. Referring again to FIG. 5A, tunnel oxide layer 505, floating gate 506, oxide layer 507, and control gate layer 508 are deposited upon semiconductor substrate 501.

In step 720 of FIG. 7, the plurality of layers are patterned to create a stack gate. Referring again to FIG. 5B, layers 505, 506, 507, and 508 have been etched to create the stack gate structure 510. As stated above, the etching of stack gate structures frequently results in unintended damage to tunnel oxide layer 505. As shown in FIG. 5B, the portions of tunnel oxide layer 505 that are located adjacent to the etched areas of stack gate 510 (e.g., regions 520 and 521 of FIG. 5B) have been damaged. In the embodiment of FIG. 5, the gate length (L) of stack gate 510 is less that 0.21 microns (0.21μ). Also shown in FIG. 5B are source region 530 and drain region 540. Source region 530 and drain region 540 are impurity concentrations created in semiconductor substrate 501.

In step 730 of FIG. 7, a rapid thermal oxidation is performed upon the stack gate. In step 630 of FIG. 6, a rapid thermal oxidation process is performed upon stack gate 510. Referring again to FIG. 5C, the damaged regions of tunnel oxide layer 505 (e.g., regions 520 and 521 of FIG. 5B) that were damaged in the etching of stack gate 510 are repaired by creating addition oxide material using a rapid thermal oxidation process.

A rapid thermal oxidation process is advantageous over conventional oxidation methods because the desired processing temperature can be reached more quickly and because the semiconductor substrate can be cooled more quickly after the processing has finished. This reduces the amount of time that areas adjacent to tunnel oxide layer 505 may are exposed to the oxidation process. As a result, tunnel oxide layer 505 exhibits a more uniform profile which allows manufacturers to utilize a more narrowly defined range of channel erase threshold voltages ($V_{TE}$).

As stated above, flash memory devices having reduced gate lengths (e.g., less than 0.21μ) may exhibit short channel effects subsequent to conventional oxidation processing methods. By a using rapid thermal oxidation process, the present invention reduces the amount of time that memory device 500 is maintained in a high temperature environment. As a result, the dopants in source region 530 and drain region 540 are less likely to diffuse into the channel region of substrate 501 underlying stack gate 510. Thus, embodiments of the present invention are advantageous over conventional oxidation processes in that short channel effects such as drain induced barrier lowering (DIBL) are less likely to be exhibited in flash memory devices fabricated in accordance with the present invention. In one embodiment, the rapid thermal oxidation process of step 730 is performed upon memory device 500 prior to creating source region 530 and drain region 540. This is advantageous because dopants in source region 530 and drain region 540 can not be diffused into the channel region underlying stack gate 510 during the rapid thermal oxidation process.

The preferred embodiment of the present invention, a method for fabricating a flash memory device, is thus described. While the present invention has been described in particular embodiments, it should be appreciated that the present invention should not be construed as limited by such embodiments, but rather construed according to the following claims.

What is claimed is:

1. A method for fabricating a flash memory device comprising:

fabricating a gate structure comprising a tunnel oxide layer, a floating gate layer, an oxide layer, and a control gate layer on a semiconductor substrate, wherein said fabricating comprises an etch process, and wherein said etch process results damage to said tunnel oxide layer;

creating a first impurity concentration in said semiconductor substrate prior to said repairing;

creating a second impurity concentration in said semiconductor substrate prior to said repairing; and repairing damage resulting from said etch process to said tunnel oxide layer prior to creating said first impurity concentration and creating said second impurity concentration wherein said repairing said tunnel oxide layer is accomplished using a rapid thermal oxidation (RTO) process, and wherein repairing said tunnel oxide layer prior to creating said first and second impurity concentrations prevents a dopant diffusion from said first and second concentration into a channel region due to said repairing.

2. The method as recited in claim 1, wherein said fabricating comprises fabricating a gate structure that is less than 0.21 microns (0.21μ) in length.

3. The method as recited in claim 1, wherein said repairing comprises:

creating additional oxide material in a damaged region of said oxide layer.

4. The method as recited in claim 1, wherein said rapid thermal oxidation process comprises exposing said semiconductor structure to a temperature of 1000° C. for a period of time not longer than 20 seconds.

5. The method as recited in claim 1, wherein said rapid thermal oxidation process comprises selecting a plurality of process parameters wherein a portion of said tunnel oxide layer retains a uniform profile after said rapid thermal process is performed.

6. A method for fabricating a memory device comprising:

fabricating a gate structure upon a semiconductor substrate, wherein said fabricating comprises an etch process wherein said gate structure comprises an tunnel oxide layer, and wherein said etch process results in damage to said oxide layer;

depositing a dopant in a first region of said semiconductor substrate and in a second region of said semiconductor substrate; and performing a rapid thermal oxidation (RTO) process upon said semiconductor substrate prior to said depositing said dopant in said first region and said second region of said semiconductor substrate, wherein additional oxide material is created in a damaged region of said tunnel oxide layer of said gate structure, and wherein said performing said RTO process prior to said depositing said dopant into said first and second regions prevents diffusion of said dopant into a channel region.

7. The method as recited in claim 6, wherein said memory device comprises a flash memory device and comprising fabricating a floating gate memory structure upon said semiconductor substrate.

8. The method as recited in claim 7, wherein said fabricating comprises fabricating a floating gate structure that is less than 0.21 microns (0.21μ) in length.

9. The method as recited in claim 6, wherein said rapid thermal oxidation process comprises selecting a plurality of process parameters wherein a portion of said tunnel oxide layer retains a uniform profile after said rapid thermal process is performed.

10. The method as recited in claim 9, wherein said rapid thermal oxidation process comprises exposing said semiconductor structure to a temperature of 1000° C. for a period of time not longer than 20 seconds.

11. A method for fabricating a memory device comprising:
    depositing a plurality of layers upon a semiconductor substrate, wherein said plurality of layers comprises a tunnel oxide layer;
    patterning said plurality of layers to create a stack gate, wherein said patterning comprises an etch process, and wherein said etch process produces a damaged region of said tunnel oxide layer;
    creating a source region wherein a first impurity concentration is deposited in said semiconductor substrate;
    creating a drain region wherein a second impurity concentration is deposited in said semiconductor substrate; and
    performing a rapid thermal oxidation (RTO) upon said stack gate prior to said creating said source region and said creating said drain region, wherein additional oxide material is created in said damaged region of said tunnel oxide layer of said stack gate, wherein said performing said RTO prior to said creating said source and drain regions prevents a dopant diffusion into from said source and said drain regions into a channel region.

12. The method as recited in claim 11, wherein said patterning comprises creating a stack gate upon said semiconductor substrate is less than 0.21 microns (0.21μ) in length.

13. The method as recited in claim 11, wherein said rapid thermal oxidation process comprises selecting a plurality of process parameters wherein a portion of said tunnel oxide layer retains a uniform profile after said rapid thermal process is performed.

14. The method as recited in claim 13, wherein said rapid thermal oxidation process comprises exposing said semiconductor structure to a temperature of 1000° C. for a period of time not longer than 20 seconds.

* * * * *